United States Patent
Asaishi

(10) Patent No.: US 7,456,934 B2
(45) Date of Patent: Nov. 25, 2008

(54) EXPOSURE APPARATUS AND DEVICE MANUFACTURING METHOD

(75) Inventor: Tadahiro Asaishi, Utsunomiya (JP)

(73) Assignee: Canon Kabushuki Kaisha, Tokyo (JP)

( * ) Notice: Subject to any disclaimer, the term of this patent is extended or adjusted under 35 U.S.C. 154(b) by 0 days.

(21) Appl. No.: 11/877,482

(22) Filed: Oct. 23, 2007

(65) Prior Publication Data

US 2008/0129974 A1    Jun. 5, 2008

(30) Foreign Application Priority Data

Dec. 1, 2006    (JP)    ............... 2006-325229

(51) Int. Cl.
G03B 27/72    (2006.01)
G03B 27/42    (2006.01)

(52) U.S. Cl. .......................... 355/69; 355/53

(58) Field of Classification Search .......... 355/53, 355/55, 67–71; 250/548; 356/399–401; 372/20, 25

See application file for complete search history.

(56) References Cited

U.S. PATENT DOCUMENTS 4,937,619 A    6/1990  Fukuda et al.
5,097,291 A *  3/1992  Suzuki ..................... 355/69
5,476,736 A   12/1995  Tanabe
5,661,547 A *  8/1997  Aketagawa et al. .......... 355/53
6,853,653 B2 * 2/2005  Spangler et al. ........... 372/20

FOREIGN PATENT DOCUMENTS

JP    64-077123 A    3/1989
JP    06-252021 A    9/1994
JP    11-162824 A    6/1999

* cited by examiner

Primary Examiner—Hung Henry Nguyen
(74) Attorney, Agent, or Firm—Canon U.S.A., Inc. I.P. Division

(57) ABSTRACT

An exposure apparatus configured to expose a substrate via a reticle includes a light source emitting light, a measuring device performing measurement of a wavelength spectrum of the light emitted from the light source, and a controller. The controller calculates a central wavelength of the light emitted from the light source based on the wavelength spectrum measured by the measuring device, calculates a difference between the calculated central wavelength and a central wavelength set to the light source for the measurement, and updates the central wavelength to be set to the light source based on the calculated difference.

6 Claims, 8 Drawing Sheets

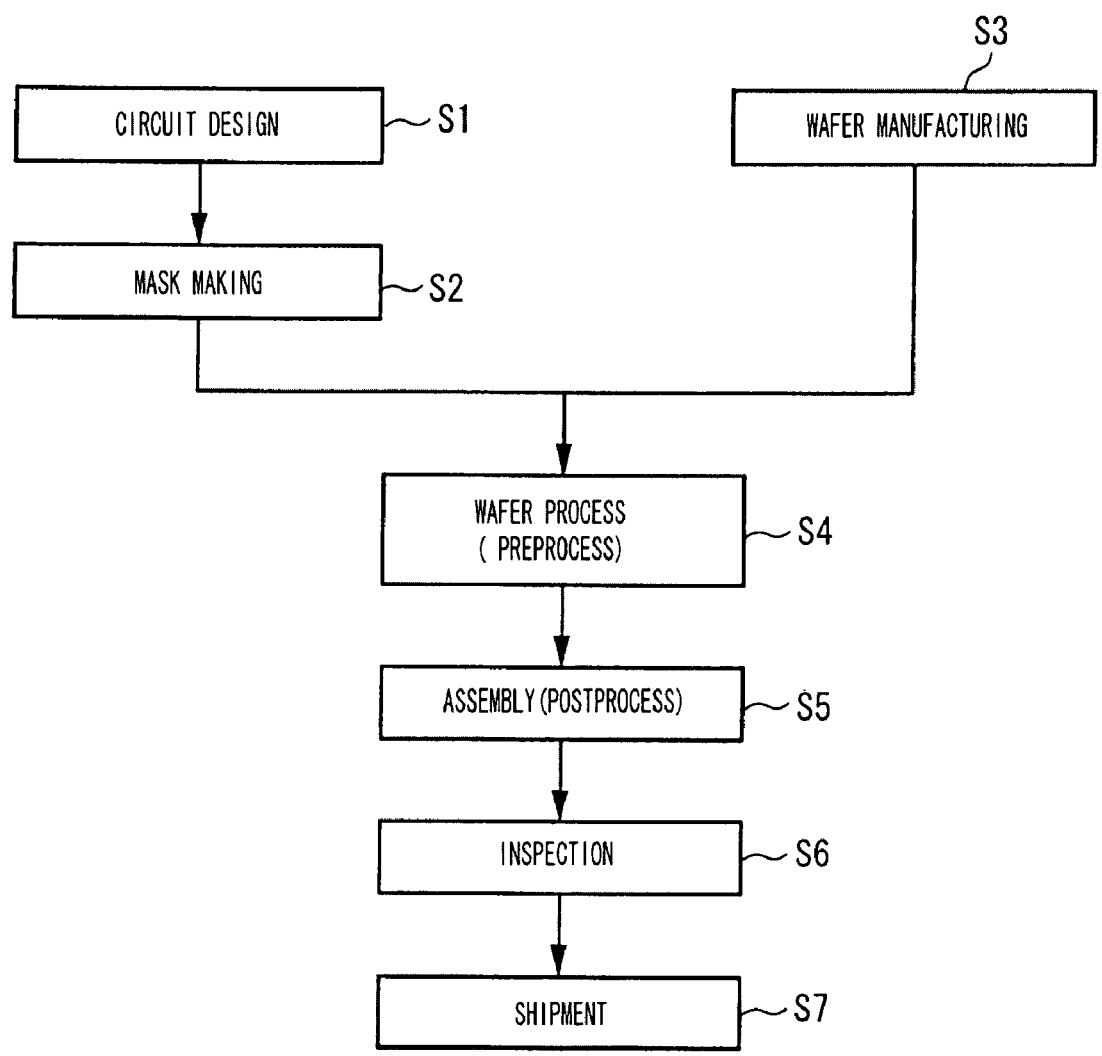

EXPOSURE APPARATUS AND DEVICE MANUFACTURING METHOD

BACKGROUND OF THE INVENTION

1. Field of the Invention

The present invention relates to an exposure apparatus usable in manufacturing a device, such as a semiconductor chip (e.g., integrated circuit (IC) or large scale integrated circuit (LSI)), a liquid crystal panel, a charge coupled device (CCD), a thin-film magnetic head, or a micro machine.

2. Description of the Related Art

A lithography manufacturing method is publicly known as a method for forming a desired circuit pattern on a semiconductor. The lithography includes a process of exposing a semiconductor substrate, on which a photosensitive organic film (photo resist) is coated, to light via a mask (reticle), on which a circuit pattern is formed.

Recent highly-integrated LSI requires more refinement of a circuit pattern. To realize this requirement, the above-described lithography requires improvement in a resolving power of an exposure apparatus that performs exposure processing.

As defined in the following formula, the resolving power of an exposure apparatus is proportional to a wavelength $\lambda$ of a light source and is inverse proportional to a numeric aperture (NA) of a projection optical system where k1 represents a proportional constant.

$$\text{Resolving power} = k1 \cdot (\lambda/NA) \quad (1)$$

Accordingly, to improve the resolving power of an exposure apparatus, it is useful to decrease the wavelength of a light source or increase the numeric aperture of the projection optical system.

The depth of focus (DOF) is one of the optical characteristics of an exposure apparatus. The depth of focus is a distance from a focal point that represents an allowable defocus range of a projected image. The following formula expresses the depth of focus, wherein k2 represents a proportional constant.

$$DOF = k2 \cdot (\lambda/NA2) \quad (2)$$

Accordingly, if the wavelength of a light source is reduced or the numeric aperture of a lens is increased to improve the resolving power of an exposure apparatus, the depth of focus decreases. As a result, the defocus state of a projected image may be out of the allowable range.

Especially, realization of a fine and solid circuit pattern is one of key factors for a next-generation device that is expected to attain high integration. Thus, reduction in the depth of focus is a serious problem. Namely, a solid circuit pattern requires a relatively long processing dimension in the optical-axis direction. Therefore, a large depth of focus is required. A sufficient depth of focus is constantly required regardless of the fineness of a circuit.

To solve the above-described problem, an attempt to enlarge the depth of focus may be performed by projecting a mask pattern on a substrate using exposure light having plural wavelengths so as to form images on different positions on the optical axis.

For example, as discussed in Japanese Patent No. 2619473, a conventional optical system includes a light source configured to generate light oscillating at a first wavelength, a light source configured to generate light oscillating at a second wavelength, and a unit configured to generate composite exposure light obtained from two light sources.

Furthermore, as discussed in Japanese Patent Application Laid-Open No. 11-162824, a conventional optical system includes a filter provided on an optical path between a light source and a wafer that can selectively transmit plural wavelength bands of light, to perform an exposure operation using exposure light having plural wavelengths. The above-described two conventional systems enable the exposure light to have plural wavelength spectra.

The amount of exposure (i.e., dose) during a wafer exposure operation is accumulated for a predetermined number of pulsed light emissions (or during a constant period of time) As discussed in Japanese Patent Application Laid-Open No. 06-252021, a setting wavelength of a light source can be changed during a wafer exposure operation so as to realize an exposure of a wafer using light having plural wavelengths. According to this conventional system, the wavelength of pulsed light emitted during an exposure operation is controlled in a range from $-\Delta\lambda$ to $+\Delta\lambda$ as illustrated in FIG. 5. The cumulative spectrum distribution on a wafer becomes a spectrum having two peak wavelengths as illustrated in FIG. 4.

FIG. 6 illustrates an excimer laser usable as a light source of a general exposure apparatus. The excimer laser includes a laser chamber 27 filled with a laser gas. A pair of main discharge electrodes 30 and 31 is provided in the laser chamber 27. The main discharge electrodes 30 and 31 generate a discharge that can excite the laser gas filled in the laser chamber 27 and generate light in the laser chamber 27.

The generated light can be amplified while it passes through windows 28 and 29 and oscillates between a front mirror 32 and a narrow-banding unit 40. A wavelength selection element (e.g., a prism or a grating) provided in the narrow-banding unit 40 outputs narrow-band light as a laser beam 33 from the front mirror 32. Part of the output laser beam 33 reflects on a beam splitter 34 and enters a monitor etalon 36 (wavelength monitor) and a diffraction grating spectroscope 37. The monitor etalon 36 and the diffraction grating spectroscope 37 measure an oscillation central wavelength $\lambda cr$ and an oscillation spectrum width $\Delta\lambda$ of the output laser beam 33. A wavelength controller 38 receives the measurement values from the monitor etalon 36 and the diffraction grating spectroscope 37.

When the above-described excimer laser controls its setting wavelength as illustrated in FIG. 5 to perform an exposure operation while maintaining the energy intensity at the same level, the symmetric wavelength spectrum illustrated FIG. 4 may not be obtained. The obtained wavelength spectrum may be asymmetric as illustrated in FIG. 7.

This phenomenon depends on the characteristics of an optical system of the excimer laser. For example, the reflectance of a grating (i.e., wavelength selection element) varies according to a selected wavelength. Therefore, the light intensity at $-\Delta\lambda$ (i.e., a wavelength shorter than a central wavelength having been set) differs from the light intensity at $+\Delta\lambda$ (i.e., a wavelength longer than the central wavelength having been set). A difference between the light intensity at $-\Delta\lambda$ and the light intensity at $+\Delta\lambda$ causes a defocus.

SUMMARY OF THE INVENTION

Exemplary embodiments of the present invention are directed to a technique capable of reducing a defocus that may be generated due to asymmetry in the wavelength spectrum.

According to an aspect of the present invention, an exposure apparatus is configured to expose a substrate to light via a reticle. The exposure apparatus includes a light source configured to emit light; a measuring device configured to measure a wavelength spectrum of the light emitted from the light source; and a controller configured to calculate a central wavelength of the light emitted from the light source based on the wavelength spectrum measured by the measuring device, calculate a difference between the calculated central wavelength and a central wavelength set to the light source when measurement is performed, and update the central wavelength to be set to the light source based on the calculated difference.

According to another aspect of the present invention, a method for manufacturing a device includes exposing a substrate to light using the above-described exposure apparatus; developing the exposed substrate; and processing the developed substrate to manufacture the device.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments and features of the invention and, together with the description, serve to explain at least some of the principles of the invention.

FIG. 8 is a flowchart illustrating exemplary manufacturing processes of a device.

DETAILED DESCRIPTION OF THE EMBODIMENTS

Figure 1:
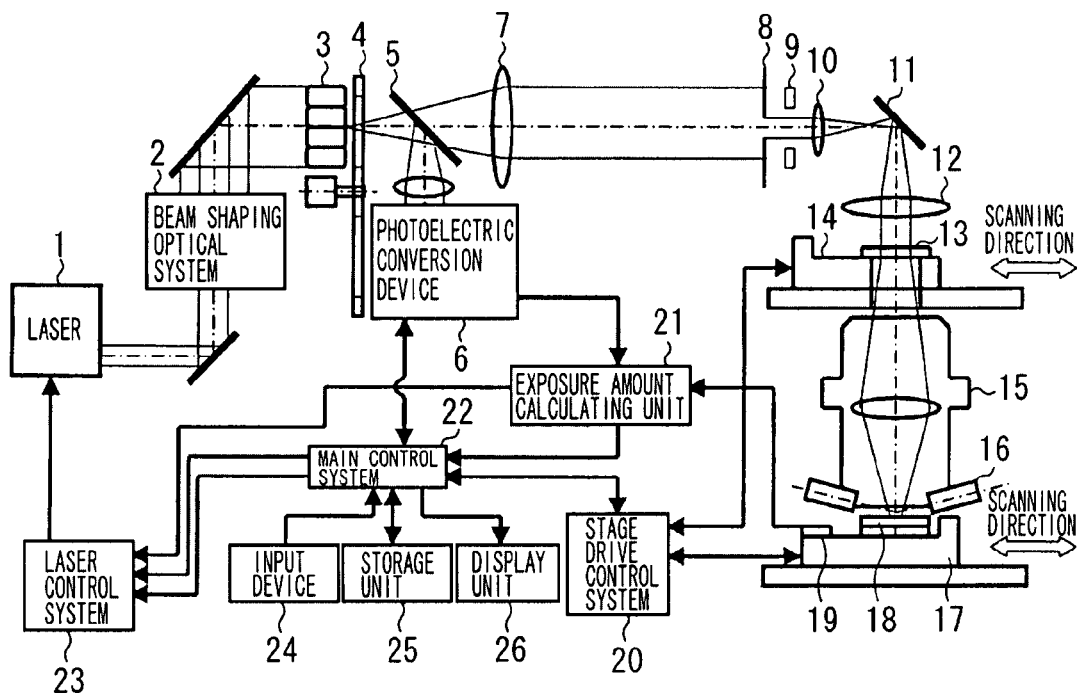
FIG. 1 illustrates an example exposure apparatus according to an exemplary embodiment of the present invention.

The following description of exemplary embodiments is illustrative in nature and is in no way intended to limit the invention, its application, or uses. It is noted that throughout the specification, similar reference numerals and letters refer to similar items in the following figures, and thus once an item is described in one figure, it may not be discussed for following figures. Exemplary embodiments will be described in detail below with reference to the drawings.

An exemplary embodiment of the present invention includes a pulsed light source and a controller. The controller integrates a wavelength spectrum measured for each pulsed light emitted from the light source, and calculates a central wavelength based on the integrated wavelength spectrum. Alternatively, the controller accumulates the integrated wavelength spectrum, and calculates a central wavelength based on the accumulated wavelength spectra. Alternatively, the controller calculates a central wavelength based on an amount of exposure being set for a substrate in addition to the integrated wavelength spectrum or the accumulated wavelength spectrum. Then, the controller calculates a deviation representing a difference between the calculated central wavelength and a central wavelength being set to the light source when measurement is performed. Furthermore, the controller calculates a central wavelength to be set to the light source based on the calculated difference.

For example, the controller can calculate the central wavelength (exposure wavelength command value) to be set to the light source for measurement of a wavelength spectrum based on a deviation regarded as zero or based on a deviation applied for a previous exposure operation.

FIG. 1 illustrates a scanning semiconductor exposure apparatus according to an exemplary embodiment of the present invention. This exposure apparatus is configured to expose a semiconductor wafer (substrate) 18 to light via a reticle (reticle) 13 and a projection optical system 15. Furthermore, the exposure apparatus performs "preprocessing" prior to actual exposure processing for irradiating a substrate (i.e., an object to be processed) with light. The preprocessing includes calculating an exposure wavelength command value to be supplied to the light source that emits light, controlling the light source according to the calculated exposure wavelength command value, and measuring a wavelength spectrum of the light emitted from the light source.

The preprocessing further includes calculating a central wavelength ($\lambda$meas indicated in FIG. 7) of the emitted light based on the wavelength spectrum, calculating a deviation ($\lambda$diff indicated in FIG. 7) of the calculated central wavelength of the light relative to a predetermined wavelength command value (exposure wavelength command value), and storing the calculated values in a recording medium. Then, a wavelength command value to be supplied to the light source that performs an actual exposure operation (i.e., emits light to the substrate) is obtained by adding or subtracting the deviation to or from the exposure wavelength command value to correct the deviation.

In FIG. 1, light from a light source (laser) 1, when it passes a beam shaping optical system 2, becomes a luminous flux having a predetermined shape. An optical integrator 3 has a plane of incidence that receives the luminous flux having passed through the beam shaping optical system 2. The optical integrator 3 includes a plurality of micro lenses and numerous secondary light sources provided adjacent to its plane of output.

Still referring to FIG. 1, a diaphragm turret 4 includes a predetermined diaphragm that limits a substantial area of the above-described secondary light sources. The diaphragm turret 4 includes a plurality of diaphragms each having an allocated number (e.g., illumination mode number). For example, the diaphragm turret 4 may include aperture diaphragms differentiated in their circular aperture areas to set plural values for the coherence factor σ, ring-shaped diaphragms for illuminating zones, or quadrupole diaphragms. The type of diaphragms is selectable according to the shape of illuminant light entered from the light source and the selected diaphragms are disposed on the optical path.

A first photoelectric conversion device 6 detects part of pulsed light reflected by a half mirror 5 as a quantity of light per pulse, and outputs an analog signal representing the detected quantity of light to an exposure amount calculating unit 21.

A condenser lens 7 performs Kohler's illumination for a blind 8 with a luminous flux from the secondary light source provided adjacent to the output plane of the optical integrator 3. A slit 9, disposed adjacent to the blind 8, deforms the profile of slit light illuminating the blind 8 into a rectangular or arc shape.

The slit light forms an image on a reticle 13 on which an element pattern is formed. The illuminance and the incident angle of the slit light are uniform on the reticle 13. The reticle 13 is positioned on a conjugate plane of the blind 8 via the condenser lens 10, 12 and a mirror 11.

An aperture area of the blind 8 is similar to a desired pattern exposure area of the reticle 13 at a ratio of optical magnification. During an exposure operation, the blind 8 shields the light outside the exposure area of the reticle 13 and performs a scanning operation synchronized with a reticle stage 14 at the ratio of optical magnification.

The reticle stage 14 supports the reticle 13. The slit light passes through the reticle 13 and enters the projection optical system 15. The slit light again forms an image in an exposure angle-of-view area on an exposure field plane which is optically conjugate with a pattern surface on the reticle 13.

A focus detection system 16 detects the height and the inclination of an exposure surface of a wafer 18 held on a wafer stage 17. A control performed for the wafer stage 17 during a scanning exposure operation can equalize the position of the exposure surface of the wafer 18 to that of the exposure field plane based on the information obtained by the focus detection system 16. The reticle stage 14 and the wafer stage 17 can synchronously travel (scan) in a direction crossing the optical axis of the projection optical system 15. At the same time, the wafer 18 is exposed to the slit light, and a pattern is transferred to a photo resist layer of the wafer 18. A second photoelectric conversion device 19, disposed on the wafer stage 17, can measure a quantity of pulsed light in the exposure angle of view.

Next, a control system according to an exemplary embodiment will be described. In FIG. 1, a stage drive control system 20 performs a synchronized traveling control (which includes an exposure surface position control) for the reticle stage 14 and the wafer stage 17 during a scanning exposure operation.

An exposure amount calculating unit 21 is configured to receive photoelectrically converted electric signals from the first photoelectric conversion device 6 and the second photoelectric conversion device 19, and output logical values converted from the received signals to a main control system 22. The first photoelectric conversion device 6 is configured to perform a measurement during an exposure operation.

The second photoelectric conversion device 19 detects a quantity of slit light emitted to the wafer 18 prior to an exposure process. At the same time, the second photoelectric conversion device 19 obtains a correlation between the detected quantity of slit light and the quantity of light detected by the first photoelectric conversion device 6.

The second photoelectric conversion device 19 calculates a monitor light quantity for an exposure control which is a quantity of light on the wafer 18 corresponding to an output value of the first photoelectric conversion device 6 with reference to the obtained correlation.

In the following description, the monitor light quantity is described as equivalent to a quantity of pulsed light on a wafer. The logical values (units: bit) of the exposure amount calculating unit 21, which are converted from the output signals of the first photoelectric conversion device 6 and the second photoelectric conversion device 19, represent a quantity of pulsed light.

The second photoelectric conversion device 19 scans and measures the exposure slit light with the wafer stage 17. The second photoelectric conversion device 19 can obtain an integrated amount of exposure measured from respective points on an exposure area and a deviation of the integrated exposure from a setting amount of exposure.

A laser control system (i.e., laser output and oscillation frequency determining unit) 23 outputs a trigger signal and an application voltage signal to the light source 1 according to a desired quantity of pulsed light. The light source 1 adjusts its oscillation frequency (wavelength) and an output energy level according to the received trigger signal and the application voltage signal. The laser control system 23 generates the trigger signal and the application voltage signal based on a pulsed light quantity signal supplied from the exposure amount calculating unit 21 and exposure parameters supplied from the main control system 22.

An input device 24, functioning as a man machine interface or a media interface, enables a user to input the desired exposure parameters (e.g., integrated exposure, required integrated exposure accuracy, and diaphragm shape) to the main control system 22. A storage unit 25 stores the input exposure parameters. A display unit 26 displays measurement results obtained by the first photoelectric conversion device 6 and the second photoelectric conversion device 19 and the correlation of the measurement results.

The main control system 22 calculates parameters required for a scanning exposure operation based on the data input via the input device 24, unique parameters of the exposure apparatus, and measurement data obtained by measurement units (e.g., first photoelectric conversion device 6 and second photoelectric conversion device 19). The main control system 22 transmits the calculated parameters to the laser control system 23 and the stage drive control system 20.

Figure 2:
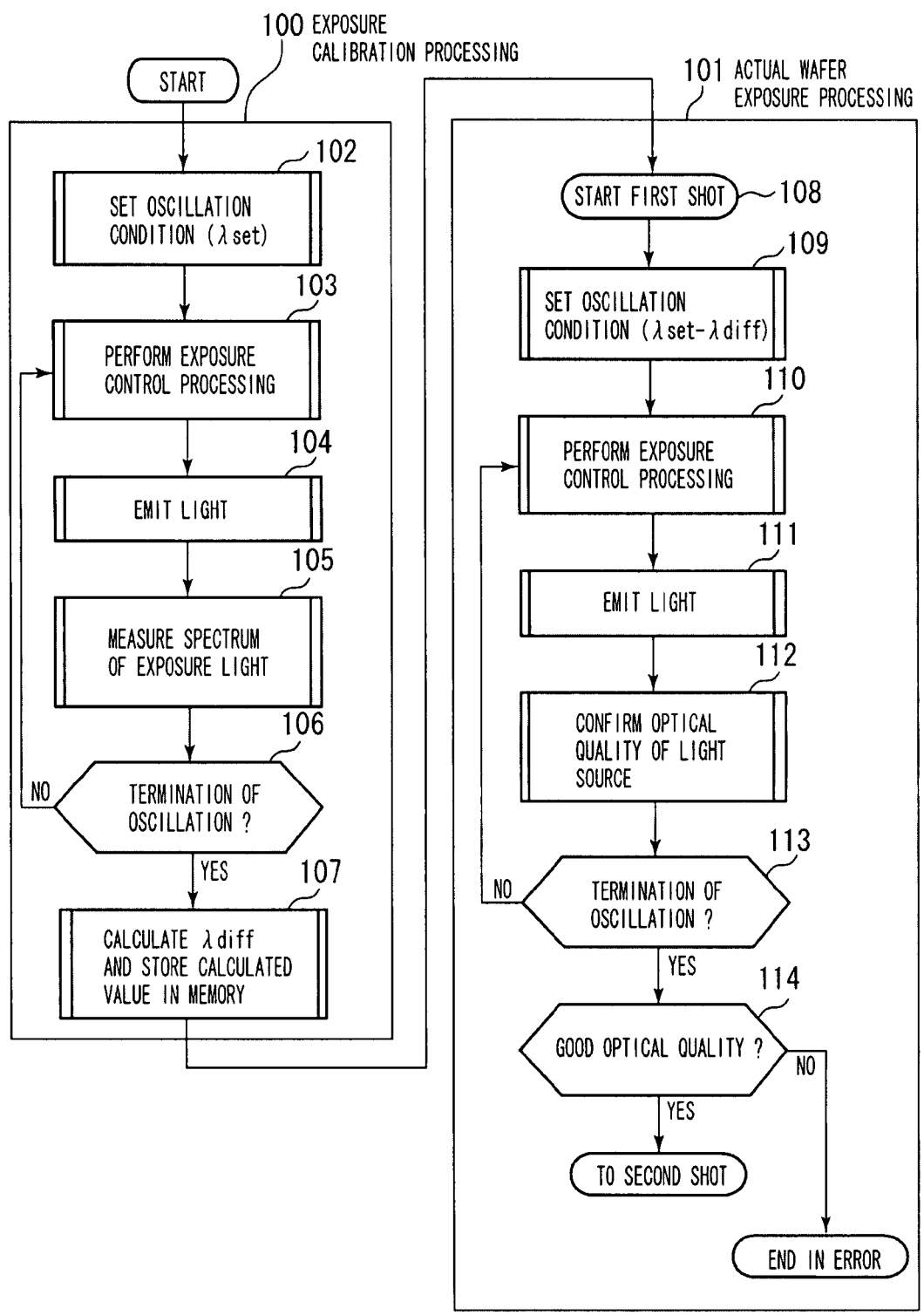
FIG. 2 is a flowchart illustrating an example wafer exposure sequence performed by the exposure apparatus illustrated in FIG. 1.

FIG. 2 is a flowchart illustrating a sequence of processing for exposing a wafer to light which is performed by the main control system 22. The processing sequence includes two sequences 100 and 101. The first sequence 100 is exposure calibration processing which is preprocessing performed prior to a wafer exposure (actual exposure) operation. The sequence 100 illustrated in FIG. 2 relates to an exemplary embodiment of the present invention.

However, in actual preprocessing, the exposure apparatus may perform a wafer positioning measurement and a focus measurement that assure the overlapping accuracy and the resolving power, after a wafer conveying unit (not illustrated in FIG. 1) has conveyed the wafer 18 to the wafer stage 17.

The second sequence 101 is the exposure sequence (i.e., actual wafer exposure processing). In general, a wafer surface has several tens of shots (i.e., area to be exposed). The sequence includes oscillation condition settings and oscillation processing repeatedly executed for respective shots. After completing the above-described processing sequence, the wafer conveying unit moves the processed wafer from the wafer stage 17 and conveys a new wafer onto the wafer stage 17. Then, the main control system 22 restarts the processing sequence including the sequences 100 and 101.

Figure 7:
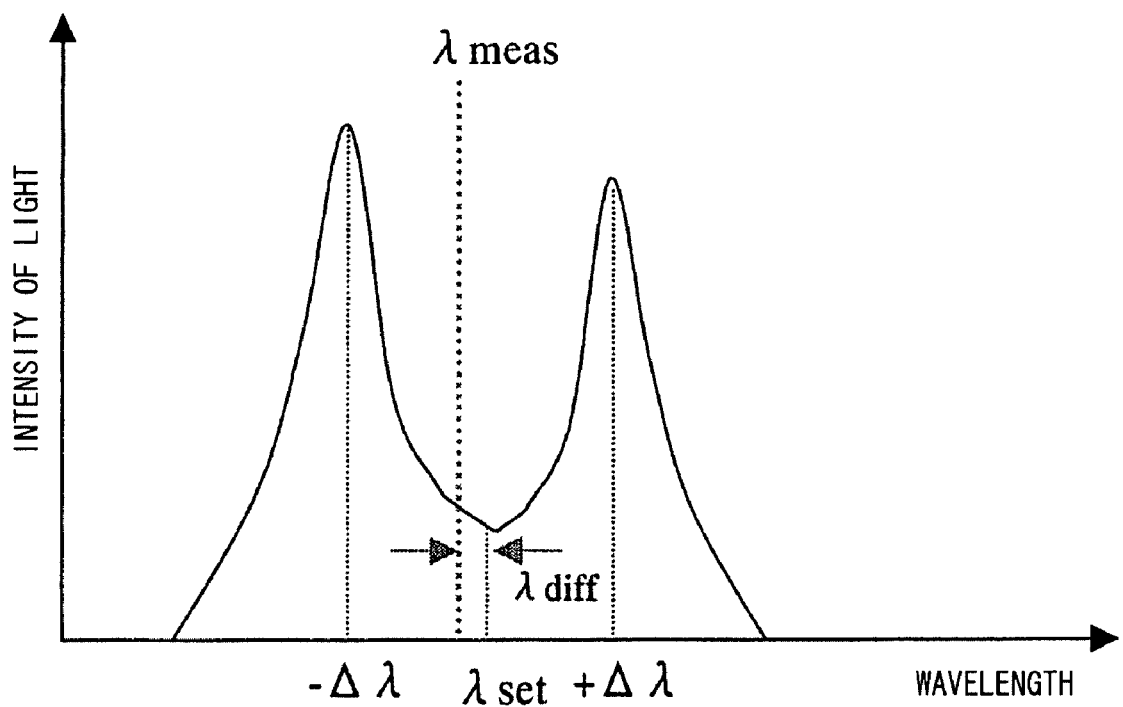
FIG. 7 illustrates an integrated wavelength spectrum of light having plural wavelengths, which has an asymmetric energy intensity distribution.

In step 102 of the sequence 100, the main control system 22 sets oscillation conditions for measuring λdiff illustrated in FIG. 7. In the oscillation condition settings, the main control system 22 calculates a scanning speed of the stage, an oscillation frequency of the light source, a target energy level of the pulsed light emission, the number of pulsed light emissions, and an exposure wavelength command (λset) according to an amount of exposure being set for the wafer. After completing the calculation of each setting value, the main control system 22 outputs the control parameters to the stage drive control system 20, the exposure amount calculating unit 21, and the laser control system 23. In this case, it is useful to set setting values respectively equal to or similar to the wafer exposure processing (actual exposure) conditions.

In step 103, the main control system 22 performs exposure control processing that includes detection of light energy emitted from the laser 1 by the first photoelectric conversion device 6 and transmission of the detected data to the exposure amount calculating unit 21. The exposure amount calculating unit 21 calculates a level of energy for the next pulsed light emission based on an output of the first photoelectric conversion device 6 and a target energy level of the pulsed light emission having been set by the main control system 22. Then, the exposure amount calculating unit 21 transmits the calculated value to the laser control system 23.

In step 104, the main control system 22 performs laser emission processing. More specifically, the laser control system 23 calculates an amount of voltage to be applied to the laser chamber 27 that can generate the energy having been set by the exposure amount calculating unit 21. The laser control system 23 sets the calculated voltage to the laser 1 and outputs a laser emission trigger to the laser 1. The laser 1 performs laser emission (laser oscillation).

Figure 6:
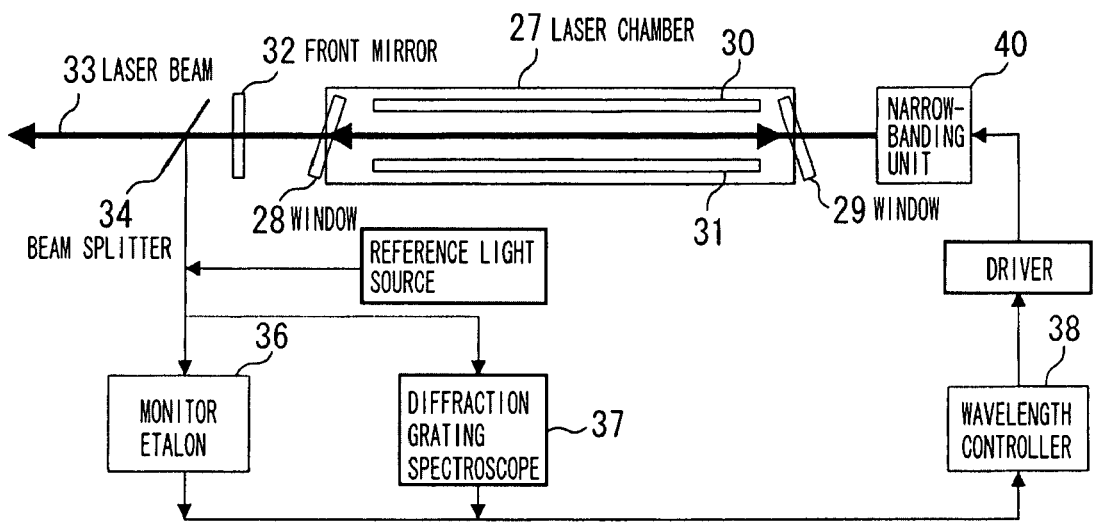
FIG. 6 illustrates an exemplary configuration of an excimer laser.

In step 105, the main control system 22 causes a spectrum measuring unit to measure a spectrum of exposure light after the laser 1 has emitted the light. The monitor etalon 36 and the diffraction grating spectroscope 37, provided in the excimer laser illustrated in FIG. 6, can perform spectrum measurement. The measurement result can be transmitted to the exposure apparatus via a high-speed serial communication medium. The exposure apparatus may include a built-in spectrum measuring unit such as a diffraction spectroscope.

In step 106, the main control system 22 determines whether the laser 1 terminates the laser oscillation (laser emission). For example, the main control system 22 can confirm whether the oscillation has satisfied predetermined termination conditions (e.g., the number of pulsed light emissions, an integrated amount of oscillation energy, etc). If the termination conditions are satisfied (YES in step 106), the main control system 22 terminates the light emission. The processing flow proceeds to the next step 107. If the termination conditions are not satisfied (NO in step 106), the processing flow returns to step 103 to calculate a target energy level.

In step 107, the main control system 22 calculates an offset for instructed wavelength. More specifically, the main control system 22 accumulates a spectrum of the exposure light measured in step 105 along the wavelength axis as indicated by a dotted line illustrated in FIG. 3. The accumulated spectrum may be obtained from a spectrum subjected to moving average processing with the number of pulses (window size) corresponding to actual exposure conditions.

The window size for a scanning exposure operation can be defined by an oscillation frequency F of the light source, a scanning speed V of the stage, and a width W of exposure light (slit image) formed on the wafer stage in the scanning direction. The window size indicates the number of exposure light (pulsed light) per point on a wafer.

$$\text{Window size} = F/V \times W \text{ [pulse]} \quad (3)$$

Figure 3:
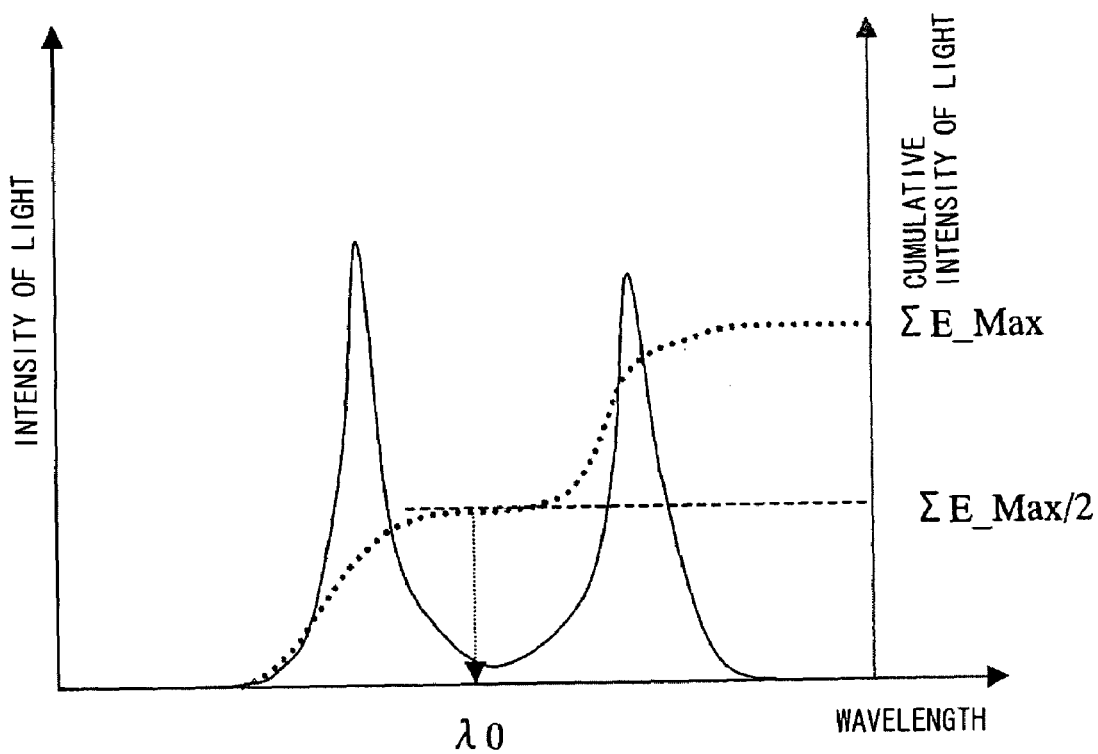
FIG. 3 illustrates an integrated wavelength spectrum of light having plural wavelengths, together with a defined central wavelength, according to an exemplary embodiment of the present invention.
Figure 4:
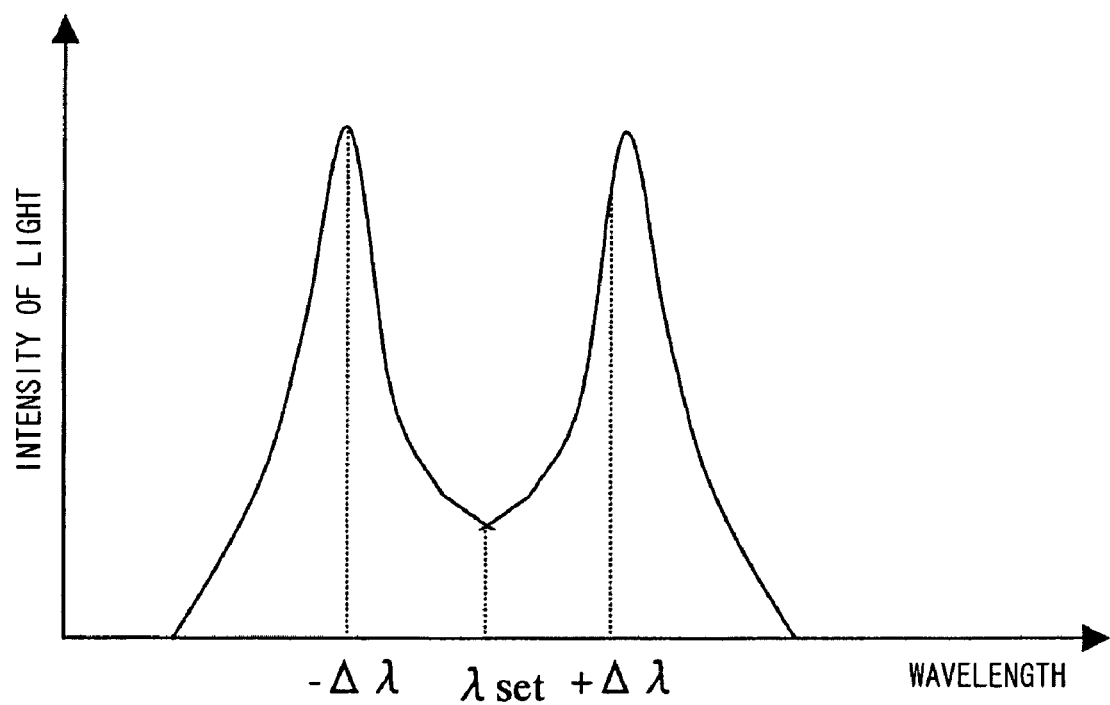
FIG. 4 illustrates an integrated wavelength spectrum of light having plural wavelengths.
Figure 5:
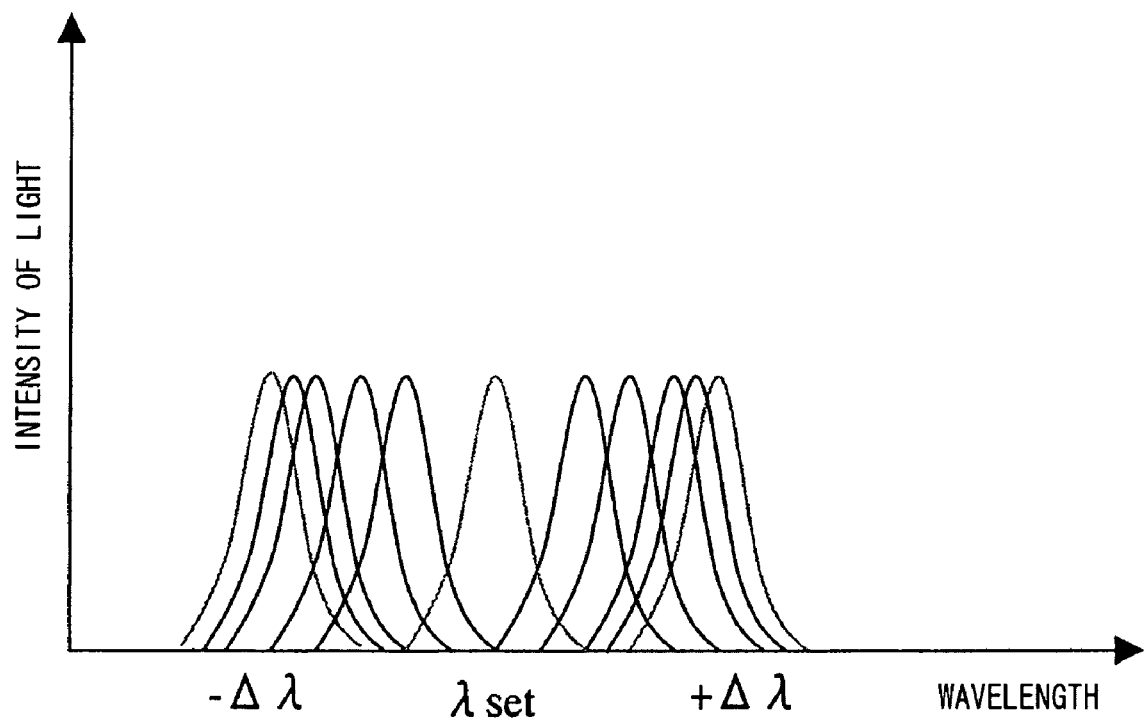
FIG. 5 illustrates a wavelength spectrum during an exposure operation using light having plural wavelengths.

The main control system 22 obtains a measured central wavelength $\lambda$meas (refer to FIG. 7) from the obtained integrated spectrum of the exposure light, and calculates a difference $\lambda$diff (refer to FIG. 7) between the measured central wavelength $\lambda$meas and an exposure wavelength command value $\lambda$set having been set. The calculated value can be stored in a memory or a recording medium. As illustrated in FIG. 3, $\lambda$meas is defined as a wavelength where the light intensity is equal to a half of the accumulated light intensity value of the optical spectrum.

Next, the main control system 22 executes the actual exposure sequence 101. In step 108, the main control system 22 starts exposure processing for the first shot of a wafer.

In step 109, the main control system 22 performs oscillation condition setting. The main control system 22 calculates a scanning speed of the stage, an oscillation frequency (wavelength) of the light source, a target energy level of the pulsed light emission, and the number of pulsed light emissions according to an amount of exposure being set for the wafer. After completing the calculation of respective setting values, the main control system 22 sets control parameters to the stage drive control system 20, the exposure amount calculating unit 21, and the laser control system 23. A setting value of the wavelength can be obtained by subtracting the difference $\lambda$diff measured in the preprocessing sequence 100 from the exposure wavelength command value ($\lambda$set).

In step 110, the main control system 22 performs exposure control processing. Similar to the processing of step 103, the exposure control processing includes detection of light energy emitted from the laser 1 by the first photoelectric conversion device 6 and calculation of a target energy level for the next pulsed light emission.

In step 111, the main control system 22 causes the light source 1 to emit light according to a target energy command value. In step 112, the main control system 22 confirms an optical quality of the light source 1. Namely, the main control system 22 monitors the optical quality of the light source 2 (e.g., wavelength of the light source, stability of line width (spectrum width)) for each pulsed light emission. According to the example illustrated in FIG. 1, the main control system 22 monitors a central wavelength of the light and a line width (e.g., FWHM) for each pulsed light emission of the laser 1. If the optical quality of the light source 2 does not satisfy the predetermined required accuracy, the exposure apparatus (the main control system 22) outputs a notification to the laser control system 23. The notification indicates that the optical quality does not satisfy the required accuracy.

In step 113, the main control system 22 determines whether the light source 1 terminates the oscillation (laser emission). To check the termination of the oscillation, the main control system 22 confirms whether oscillation termination conditions (e.g., the number of pulsed light emissions, an integrated amount of oscillation energy, etc) are satisfied. If the main control system 22 determines that the termination conditions are satisfied (YES in step 113), the processing flow proceeds to the next step 114. If the main control system 22 determines that the termination conditions are not satisfied (NO in step 113), the processing flow returns to step 110 to calculate a target energy level.

In step 114, the main control system 22 determines whether the optical quality is good based on the confirmation result of the optical quality monitored in step 112. If the main control system 22 determines that the optical quality cannot assure the exposure performances (NO in step 114), the processing ends in error. If the main control system 22 determines that the optical quality can assure the exposure performances (YES in step 114), the main control system 22 executes oscillation condition settings for the next shot to initiate the exposure processing for the next shot. In this manner, the main control system 22 repeatedly executes the processing of steps 109 to 114 until the exposure processing for all shots of the wafer has completed.

As described above, when the light emitted from the light source includes plural wavelengths, an exemplary embodiment measures a deviation of a wavelength spectrum prior to an actual exposure operation if the symmetry of the wavelength spectrum deviates in the wavelength-axis direction, and corrects the wavelength spectrum based on the measured deviation. Therefore, an exemplary embodiment can suppress the effect of a defocus caused by a deviated symmetry of the wavelength spectrum.

The above-described exemplary embodiment performs the preprocessing for each wafer and calculates the wavelength command value λset in the preprocessing based on actual exposure parameters. However, an exemplary embodiment may perform the preprocessing for each wafer cassette, each lot, or when an exposure parameter or an exposure detection value in an actual exposure operation exceeds a predetermined amount, or based on the characteristics or stability of the light source or the projection optical system. Furthermore, the wavelength command value λset in the preprocessing can be obtained from actual exposure values in a preceding operation or any other values.

Exemplary manufacturing processes of a micro device using the above-described exposure apparatus (such as a semiconductor chip (e.g., IC or LSI), a liquid crystal panel, a CCD, a thin-film magnetic head, or a micro machine) are described below.

FIG. 8 is a flowchart illustrating exemplary manufacturing processes of a semiconductor device. Step S1 is a circuit design process for designing a circuit of a semiconductor device. Step S2 is a mask making process for fabricating a mask (which may be referred to as an original plate or a reticle) that forms a designed pattern. Step S3 is a wafer manufacturing process for manufacturing a wafer (which may be referred to as a substrate) from a silicon or comparable material. Step S4 is a wafer process (which is referred to as "preprocess") for forming an actual circuit on a wafer using an exposure apparatus with the above-described prepared mask according to the lithography technique.

Step S5 is an assembling process (which is referred to as "postprocess") for forming a semiconductor chip using the wafer manufactured in step S4. The postprocess includes an assembly process (e.g., dicing, bonding, etc) and a packaging process (chip sealing). Step S6 is an inspection process for inspecting the semiconductor device manufactured in step S5. The inspection includes an operation confirmation test and an endurance test. Step S7 is a shipment process for shipping the semiconductor device completed through the above-described processes.

The above-described wafer process in step S4 includes an oxidation step of oxidizing a wafer surface, a chemical vapor deposition (CVD) step of forming an insulating film on the wafer surface, and an electrode formation step of forming electrodes on the wafer by vaporization.

Furthermore, the wafer process includes an ion implantation step of implanting ions into the wafer, a resist processing step of coating the wafer with a photosensitive material, and an exposure step of exposing the wafer subjected to the resist processing step using the above-described exposure apparatus with a mask having a circuit pattern.

Furthermore, the wafer process in step S4 includes a developing step of developing the wafer exposed in the exposure step, an etching step of cutting a portion other than a resist image developed in the developing step, and a resist separating step of removing unnecessary resist remaining after the etching step is accomplished. The processing repeating the above-described steps can form multiple circuit patterns on a wafer.

Accordingly, the above-described exemplary embodiments can reduce the defocus caused by asymmetry in the wavelength spectrum.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2006-325229 filed Dec. 1, 2006, which is hereby incorporated by reference herein in its entirety.

What is claimed is:

1. An exposure apparatus configured to expose a pattern of a reticle on a substrate with light, the exposure apparatus comprising:
    an illumination system configured to illuminate the reticle with the light, a wavelength spectrum of the light having a plurality of peaks, according to a command value;
    a measuring device configured to measure the wavelength spectrum of the light emitted from the illumination system; and
    a controller configured to update the command value using a difference between a first central wavelength, the command value being set based on the first central wavelength, and a second central wavelength, the second central wavelength being calculated based on a measurement result by the measuring device.

2. An exposure apparatus according to claim 1, wherein the illumination system includes a light source configured to emit a plurality of pulsed lights, wavelengths of the plurality of pulsed lights differing, and wherein the difference between the first central wavelength and the second central wavelength depends on optical characteristics of the light source.

3. An exposure apparatus according to claim 2, wherein the second central wavelength is calculated based on an accumulated light intensity value of the plurality of pulsed lights.

4. An exposure apparatus according to claim 2, wherein the controller determines whether exposure performance is good or not based on optical quality, monitored for each pulsed light, of the light source.

5. An exposure apparatus according to claim 1, wherein the command value is calculated based on a desired exposure amount.

6. A device manufacturing method utilizing an exposure apparatus, the exposure apparatus including an illumination system configured to illuminate a reticle with light, a wavelength spectrum of the light having a plurality of peaks, according to a command value; a measuring device configured to measure the wavelength spectrum of the light emitted from the illumination system; and a controller configured to update the command value using a difference between a first central wavelength, the command value being set based on the first central wavelength, and a second central wavelength, the second central wavelength being calculated based on a measurement result by the measuring device, the method comprising:
    exposing a substrate using the exposure apparatus; and
    developing the substrate,
    wherein the exposure apparatus is configured to expose a pattern of the reticle on the substrate with the light.

* * * * *